(12) United States Patent
Ogino et al.

(10) Patent No.: US 7,038,325 B2
(45) Date of Patent: May 2, 2006

(54) WIRING TAPE FOR SEMICONDUCTOR DEVICE INCLUDING A BUFFER LAYER HAVING INTERCONNECTED FOAMS

(75) Inventors: Masahiko Ogino, Hitachi (JP); Shuji Eguchi, Ibaraki-ken (JP); Akira Nagai, Hitachi (JP); Takumi Ueno, Mito (JP); Masanori Segawa, Hitachi (JP); Hiroyoshi Kokaku, Hitachi (JP); Toshiaki Ishii, Hitachi (JP); Ichiro Anjoh, Koganei (JP); Asao Nishimura, Kokubunji (JP); Chuichi Miyazaki, Akishima (JP); Mamoru Mita, Hitachi (JP); Norio Okabe, Hitachi (JP)

(73) Assignees: Hitachi Cable, Ltd., Tokyo (JP); Renesas Technology Corp., Tokyo (JP)

( * ) Notice: Subject to any disclaimer, the term of this patent is extended or adjusted under 35 U.S.C. 154(b) by 0 days.

(21) Appl. No.: 10/830,051

(22) Filed: Apr. 23, 2004

(65) Prior Publication Data

US 2004/0195702 A1     Oct. 7, 2004

Related U.S. Application Data

(60) Continuation of application No. 10/134,364, filed on Apr. 30, 2002, now abandoned, which is a division of application No. 09/092,138, filed on Jun. 5, 1998, now Pat. No. 6,433,440.

(30) Foreign Application Priority Data

Jun. 6, 1997     (JP)                 09-149106

(51) Int. Cl.
     *H01L 23/48*     (2006.01)
     *H01L 23/52*     (2006.01)
     *H01L 29/40*     (2006.01)

(52) U.S. Cl. .................................................. 257/783

(58) Field of Classification Search .................. 257/783
See application file for complete search history.

(56) References Cited

U.S. PATENT DOCUMENTS

| | | | |
|---|---|---|---|
| 5,116,663 A | | 5/1992 | Fujimoto et al. |
| 5,148,265 A | | 9/1992 | Khandros et al. |
| 5,237,205 A | * | 8/1993 | Newman .................... 257/783 |
| 5,252,383 A | | 10/1993 | Fukutake et al. |
| 5,294,487 A | | 3/1994 | Oshashi et al. |
| 5,446,315 A | | 8/1995 | Hazaki et al. |
| 5,561,323 A | | 10/1996 | Andros et al. |
| 5,668,405 A | | 9/1997 | Yamashita |
| 5,773,509 A | | 6/1998 | Yoshida et al. |
| 5,800,758 A | | 9/1998 | Topolkaraev |
| 5,866,949 A | | 2/1999 | Schueller |

(Continued)

FOREIGN PATENT DOCUMENTS

EP           4-12323 A2     7/1990

(Continued)

*Primary Examiner*—Howard Weiss
(74) *Attorney, Agent, or Firm*—Antonelli, Terry, Stout and Kraus, LLP.

(57) ABSTRACT

In a semiconductor device having a three-layered buffer layer comprising core layer 1 having interconnected foams such as a three-dimensional reticular structure and adhesive layers 2 provided on both sides of the core layer as a stress buffer layer between semiconductor chip 5 and wiring 4 to lessen a thermal stress generated between the semiconductor device and the package substrate, where a thickness ratio of the core layer 1 to total buffer layer is at least 0.2, the production process can be simplified by using such a buffer layer, thereby improving the mass production capacity and enhancing the package reliability.

9 Claims, 4 Drawing Sheets

U.S. PATENT DOCUMENTS

| | | |
|---|---|---|
| 5,895,965 A | 4/1999 | Tanaka et al. |
| 5,933,708 A | 8/1999 | Sim et al. |
| 5,973,389 A | 10/1999 | Culnane et al. |
| 5,990,563 A | 11/1999 | Kim |
| 6,252,298 B1 | 6/2001 | Lee et al. |
| 6,433,440 B1 * | 8/2002 | Ogino et al. ................ 257/784 |

FOREIGN PATENT DOCUMENTS

| | | |
|---|---|---|
| EP | 4-12323 A3 | 7/1990 |
| EP | 504669 A1 | 3/1992 |
| EP | 751561 A1 | 3/1995 |
| JP | 2-49544 | 10/1990 |
| JP | 4-363032 | 12/1992 |
| JP | A-7-245471 | 9/1995 |
| JP | A-9-115963 | 5/1997 |
| JP | 9260535 | 10/1997 |
| JP | A-10-22325 | 1/1998 |
| JP | 10081857 | 3/1998 |
| JP | 10-110057 A * | 4/1998 |
| JP | A-10-326809 | 8/1998 |

* cited by examiner

WIRING TAPE FOR SEMICONDUCTOR DEVICE INCLUDING A BUFFER LAYER HAVING INTERCONNECTED FOAMS

CROSS-REFERENCE TO RELATED APPLICATIONS

This is a Continuation application of Ser. No. 10/134,364, filed Apr. 30, 2002 now abandoned, which is a Divisional of parent application Ser. No. 09/092,138, filed Jun. 5, 1998, now U.S. Pat. No. 6,433,440, the entire disclosure of which is hereby incorporated by reference.

BACKGROUND OF THE INVENTION

The present invention relates to a semiconductor device for use in high density-packaged modules, multichip modules, etc. and a wiring tape for use in preparation of the semiconductor device.

With recent trends to make electronic devices smaller in scale and higher in performance, a higher degree of integration, a higher density and a higher processing speed have been required for the semiconductor devices for use therein. Correspondingly, packaging procedures for the semiconductor devices have been also shifted from the pin insertion type towards the surface mount type. To meet higher pin counts, packages including DIP (dual inline package), QFP (quad flat package), PGA (pin grid array), etc. have been also developed.

However, QFP is provided with concentrated connection leads to a package substrate only at the peripheral region of the package and the leads per se are so fine that they are liable to deform, resulting in difficulty in packaging to meet the trend for higher pin counts. PGA has long and fine and highly dense terminals for connection to a package substrate, resulting in difficulty in realization of higher speed, and also is of a pin insertion type and thus incapable of attain surface packaging. That is, PGA has no advantage in case of high density packing.

To solve these problems and realize semiconductor devices capable of meeting higher speed requirements, a BGA (ball grid array) package having a stress buffer layer between the semiconductor chip and the wiring layer and also having ball-like connection terminals on the package substrate-facing side of the wiring layer has been recently developed (U.S. Pat. No. 5,148,265). In the package with this structure, the terminals for connection to the package substrate are of a ball-like solder, and thus there is no such lead deformation as in case of QFP, and distribution of terminals all over the package surface enables to make interterminal pitches larger and surface packaging easier. Furthermore, the connection terminals are shorter than those of PGA, and thus inductance components are smaller with accelerated signal speed, thereby enabling to meet the higher speed requirements.

For the stress buffer layer in the BGA package, an elastomer is used. Specifically, the stress buffer layer for a semiconductor device is provided in such a package structure comprising a wiring layer with a wiring formed on a support made from such an insulating material as polyimide, etc.; an elastomer of low elasticity such as silicone, etc., formed on the wiring layer; a semiconductor chip; and a substrate for heat radiation and for supporting a semiconductor device. Elastomer for the buffer layer can be formed by printing using a metal mask or by pasting a sheet-like elastomer. For formation of the buffer layer by printing, the following four steps are required: printing, heat curing, adhesive application and chip pasting. A heat set type, silicone elastomer material, when used, brings about such a problem as contamination of the wiring layer, packaging apparatuses, etc. due to evaporated components, etc. during the curing, thereby deteriorating the reliability in electrical connection between the semiconductor chip and the leads, when made therebetween. In pasting sheet-like elastomer, steam explosion due to steam absorbed during the package reflow occurs, thereby bringing about such problems as expansion of the package and peeling of the wiring layer.

SUMMARY OF THE INVENTION

An object of the present invention is to provide a semiconductor device having a high reliability and extremely less occurrence of failure at the package reflow in the above-mentioned semiconductor package structure.

According to a first aspect of the present invention, there is provided a semiconductor device, which comprises a semiconductor chip having a circuit-formed surface provided with a group of terminals thereon; a wiring layer comprising an insulating layer and a wiring for connecting the group of terminals to a group of external terminals provided on the surface of the insulating layer, the surface facing the circuit-formed surface of the semiconductor chip; a three-layered buffer layer provided between the circuit-formed surface of the semiconductor chip and the wiring layer, the buffer layer comprising a structure having interconnected foams, an adhesive layer provided on the semiconductor chip-facing side of the structure having interconnected foams, directed to pounding to the semiconductor chip and another adhesive layer provided on the other side of the structure, directed to bonding to the wiring layer; a sealant for sealing connections of the group of terminals provided on the semiconductor chip to the wiring layer; and the group of external terminals connected to the wiring layer.

According to a second aspect of the present invention, there is provided a wiring tape for a semiconductor device, which comprises a wiring layer comprising an insulating layer and a wiring on an insulating layer, one end of the wiring being connected to terminals on the semiconductor chip and the other end of the wiring being connected to external terminals for connecting to a package substrate; and a three-layered buffer layer bonded to the wiring-provided side of the wiring layer, the buffer layer comprising a structure having interconnected foams, an adhesive layer provided on the semiconductor chip-facing side of the structure having interconnected foams, directed to ponding to the semiconductor chip and another adhesive layer provided on the other side of the structure, directed to bonding to the wiring layer.

BRIEF DESCRIPTION OF THE DRAWINGS

FIGS. 2A and 2B show a semiconductor device according to one embodiment of the present invention, where

FIGS. 4A and 4B show a semiconductor device according to a further embodiment of the present invention, where

DESCRIPTION OF THE PREFERRED EMBODIMENTS

The present semiconductor device has a three-layered buffer layer comprising a core layer in a structure having interconnected foams and adhesive layers provided on both sides of the core layer, respectively, to lessen a thermal stress generated between a semiconductor chip and a package substrate. The conventional procedure for forming a stress buffer layer by printing requires 4 steps from the elastomer formation to chip pasting, whereas use of the present three-layered buffer layer can reduce the number of steps to 2, and since the core layer is in a gas-permeable structure having interconnected foams, steam pressure generated at package reflow can be released to the outside through the core layer, thereby preventing expansion or peeling of the wiring layer.

The present invention provides a semiconductor device, which comprises a semiconductor chip having a circuit-formed surface provided with a group of terminals thereon; a wiring layer comprising an insulating layer and a wiring for connecting the group of terminals to a group of external terminals provided on the surface of the insulating layer, the surface facing the circuit-formed surface of the semiconductor chip; a three-layered buffer layer provided between the circuit-formed surface of the semiconductor chip and the wiring layer, the buffer layer comprising a structure having interconnected foams as a core layer, an adhesive layer provided on the semiconductor chip-facing side of the structure having interconnected foams, directed to bonding to the semiconductor chip and another adhesive layer provided on the other side of the structure, directed to the wiring layer; a sealant for sealing connections of the group of terminals provided on the semiconductor chip to the wiring layer; and the group of external terminals connected to the wiring layer.

The buffer layer comprises a core layer in a structure having interconnected foams, and adhesive layers provided on both sides of the core layer, respectively, where a thickness ratio of the core layer to the total buffer layer is preferably at least 0.2. The structure having interconnected foams means a porous body having a large number of pores and includes a three-dimensional reticular structure. The structure having interconnected foams can be a non-woven fabric formed from three-dimensionally entangled fibrous compounds. The semiconductor chip can be a silicon chip having a semiconductor circuit formed on a silicon wafer by a desired process such as logic, memory, gate array, etc. The present semiconductor device can be provided with a heat radiation, support substrate on the opposite surface of the semiconductor chip to the circuit-formed surface. The support substrate can be made from metals such as aluminum, iron, nickel, tungsten, etc. or alloys of at least two of these metals in combination or ceramic materials such as alumina, etc. The opposite surface of the support substrate may be processed into a fin shape to maximize the surface area and enhance the heat radiation.

The present semiconductor device can be also provided in the following embodiments.

A) A semiconductor device, which comprises a semiconductor chip having a circuit-formed surface provided with a group of terminals thereon; a support substrate covering an opposite surface of the semiconductor chip to the circuit-formed surface and side ends of the semiconductor chip; a wiring layer comprising an insulating layer and a wiring for connecting the group of terminals to a group of external terminals provided on the surface of the insulating layer, the wiring layer being provided on the side facing the circuit-formed surface of the semiconductor chip and extended over to the support substrate; a three-layered buffer layer provided between both of the circuit-formed surface of the semiconductor chip and the support substrate and the wiring layer, the buffer layer comprising a structure having interconnected foams, an adhesive layer provided on the semiconductor chip-facing side of the structure having interconnected foams, directed to bonding to the semiconductor chip and another adhesive layer provided on the other side of the structure, directed to bonding to the wiring layer; a sealant for sealing connections of the group of terminals provided on the semiconductor chip to the wiring layer; and the group of external terminals connected to the wiring layer, positioned on the support substrate.

B) A semiconductor device, which comprises a semiconductor chip having a circuit-formed surface provided with a group of terminals thereon; a support substrate covering an opposite surface of the semiconductor chip to the circuit-formed surface and side ends of the semiconductor chip; a wiring layer comprising an insulating layer and a wiring for connecting the group of terminals to a group of external terminals provided on the surface of the insulating layer, the wiring layer being provided on the side facing the circuit-formed surface of the semiconductor chip and extended over to the support substrate; a three-layered buffer layer provided between both of the circuit-formed surface of the semiconductor chip and the support substrate and the wiring layer, the buffer layer comprising a structure having interconnected foams, an adhesive layer provided on the semiconductor chip-facing side of the structure having interconnected foams, directed to bonding to the semiconductor chip and another adhesive layer provided on the other side of the structure, directed to bonding to the wiring layer; a sealant for sealing connections of the group of terminals provided on the semiconductor chip to the wiring layer; and the group of external terminals connected to the wiring layer, positioned within the region of the semiconductor chip and on the support substrate.

In the above-mentioned semiconductor devices with various modifications, the group of terminals provided on the surface of the semiconductor chip may be arranged in one direction on the central region on the circuit-formed surface of the semiconductor chip, or may be arranged in the peripheral region on the circuit-formed surface of the semiconductor chip. Further, the group of external terminals may be arranged within the region of the semiconductor chip.

Further, the wiring layer may be provided with a window at a position of connection to the group of terminals on the semiconductor chip. In addition, extensions of the wiring in the wiring layer may be connected to the group of terminals provided on the semiconductor chip.

The present invention can be also provided in the following embodiment:

A wiring tape for a semiconductor device, which comprises a wiring layer comprising an insulating layer and a wiring on the insulating layer, one end of the wiring being connected to terminals on the semiconductor chip and the other end of the wiring being connected to external terminals for connecting to a package substrate; and a three-layered buffer layer bonded to the wiring-formed side of the wiring layer, the buffer layer comprising a structure having interconnected foams as a core layer, an adhesive layer provided on the semiconductor chip-facing side of the structure having interconnected foams, directed to the semiconductor chip and another adhesive layer provided on the other side of the structure, directed to bonding to the wiring layer.

The present wiring tape comprises a conductor layer, i.e. a wiring, an insulating layer and a stress buffer layer, where the stress buffer layer comprises a core layer composed of an interconnected foam structure and adhesive layers provided on both sides of the core layer, respectively, and a thickness ratio of the core layer to the entire stress buffer layer is preferably at least 0.2.

The interconnected foam structure of the wiring tape can be made of non-woven fabric of three-dimensionally entangled fibrous compounds. The insulating layer of the wiring tape can be preferably made of engineering plastics having a high heat resistance and distinguished mechanical characteristics such as polyimide, etc. The conductor layer, i.e. wiring, can be formed from gold, copper, aluminum or their top surface-gold plated ones by patterning. The wiring tape may be further provided with a ground layer or a power source layer besides the wiring in view of its electrical characteristics.

External terminals for electrical connection between a package substrate and a semiconductor device mounted thereon is a heat-meltable, electrically connectable electric conductor. The external terminals can electrically connect the semiconductor device to the package substrate by shaping solder alloys containing tin, zinc or lead, silver, copper or alloy into ball-like shapes or in case of other materials than gold by coating them with gold beforehand, followed by bringing the balls into contact and vibration with or without heat melting. Besides the above-mentioned structure of external terminals, ball-like terminals may be in such a structure made of one of molybdenum, nickel, copper, platinum, titanium, etc. or alloys of at least two thereof in combination, or at least two of these metals and metallic alloys as a multilayered film.

The adhesive layers for use in the buffer layer in the wiring tape and the semiconductor device can be made from either a thermoplastic resin or a thermosetting resin, in a simple resin structure composed of such resins as epoxy resin, maleimide resin, phenol resin, cyanate resin, resol, polyamide, polyimide, polyamide-imide, polyester, polyolefin, polyurethane, etc. or their mixtures. Besides the above-mentioned resins, materials capable of showing an adhesiveness upon heating, drying, pressuring, light irradiation, etc. can be used. Furthermore, the adhesive layers may be in a sheet-like structure such as cloth-like core materials, etc. impregnated with the above-mentioned resins besides the simple resin structure.

Materials for use in the core layer used in the structure having interconnected foams in the semiconductor device and the wiring tape can include such resin as polycarbonate, polyester, polytetraflouoroethylene, polyethylene, polypropylene, polyvinylidene fluoride, cellulose acetate, polysulfone, polyacrylonitrile, polyamide, polyimide, etc., and a fluorine-containing resin is preferably used. Three-dimensional reticular structure with fine pores can be formed by treating these materials by a track etching process based on neutron irradiation and chemical etching; a stretching process based on stretching of crystalline polymers after heating or plasticization with a plasticizer; a molten layer separation process based on use of solvents having different solubilities depending on temperatures; an extraction process based on mixing of the polymers with an inorganic salt or silica, followed by film formation and extraction only of the inorganic salt or silica; or a layer transfer process based on mixing the polymers with a good solvent, a poor solvent, etc., followed by film formation and successive drying off only the good solvent. Non-woven fabrics are sheets of these resins in fiber forms obtained by polymerization in a solvent. Any interconnected foam structure can be used as core layer besides the above-mentioned ones, so long as it has a gas permeability.

A buffer layer sheet having a stress buffer mechanism or a three-layered buffer layer can be prepared by coating or pasting both sides of the core layer with adhesive layers or sheet-like adhesive layers, respectively. Alternatively, the buffer layer may be composed by a laminate obtained by pasting the adhesive layers filled with an adhesive into pores of an interconnected foam structure on both sides of the structure having interconnected forms, respectively. As a result of investigation on relations between the core layer thickness ratio and the reliability for semiconductor device packaging, it has been found desirable that a thickness ratio of the core layer to the entire buffer layer is at least 0.2.

Figure 1:
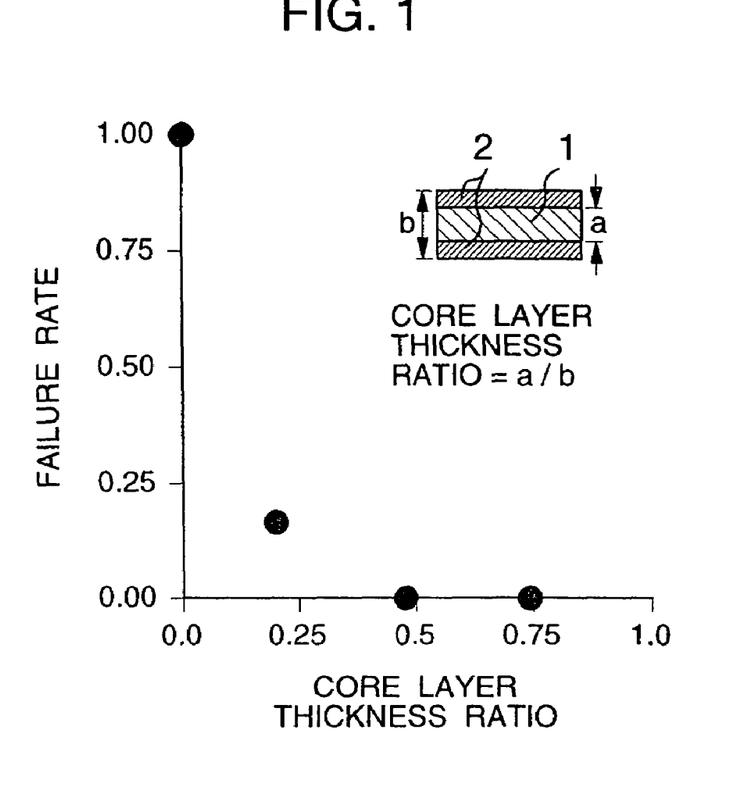
FIG. 1 is a graph showing relations between the thickness ratio of core layer to total buffer layer and the failure rate at package reflow.

FIG. 1 is a graph showing relations between a thickness ratio of the core layer to the entire buffer layer and a failure rate at package reflow, where a ratio (a/b) of thickness (a) of core layer 1 to total thickness (b) of buffer layer (i.e. sum total of thickness of core layer 1 and thickness of adhesive layers 2) is plotted on the abscissa and a failure rate at the package reflow is plotted on the ordinate. Reflow tests were carried out with test pieces of semiconductor device packages using buffer layer sheets with total thicknesses (b) of core layer and adhesive layers being 100 μm, 150 μm and 200 μm by leaving the test pieces in a circumstance at a temperature of 85° C. and a relative humidity of 85% for 168 hours to allow the test pieces to absorb the moisture, then heating the test pieces up to 160° C. at a rate of 5° C./second, keeping at 160° C. for 60 seconds, then heating again up to 240° C. at a rate of 5° C./second, and keeping at 240° C. for 5 seconds, following by cooling.

It can been seen from FIG. 1 that the failure rate increases abruptly in a core layer thickness ratio (a/b) of less than 0.2. That is, the package reliability of the present semiconductor device can be drastically improved by making the core layer thickness ratio (a/b) of the buffer layer having a stress buffer mechanism at least 0.2. The presence of the core layer can release the steam pressure even upon heating the moisture-absorbed semiconductor device at the package reflow, thereby preventing the semiconductor device from breaking and improving the package reliability. The core layer has desirably a thickness of 80 to 200 μm. By making the thickness of core layer not less than 80 μm, a sag can be given to leads connecting to the semiconductor chip terminals, thereby making breaking of leads less. Above 200 μm, the buffer effect will be reduced. The adhesive layers have preferably a thickness of 1 to 30 μm. That is, the present semiconductor device has a buffer layer having a stress buffer mechanism in a three-layered structure comprising a core layer of interconnected foam structure (i.e. core layer capable of releasing steam pressure) and adhesive layers provided on both sides of the core layer, respectively, where a ratio (a/b) of core layer thickness (a) to total thickness (b) of buffer layer is made not less than 0.2.

According to the present invention, a thermal stress developed between the semiconductor device and the package substrate can be lessened by the buffer layer provided between the semiconductor chip and the wiring layer. Furthermore, the production process can be simplified by using a buffer layer of three-layered structure comprising a core layer of interconnected foam structure and adhesive layers provided on both sides of the core layer, respectively, thereby improving the mass production capacity. No such heat set type silicone materials are used for the core layer and thus the semiconductor chip can be prevented from contamination at heat setting. Furthermore, steam pressure at the package reflow can be released through the porous core layer of three-dimensional reticular structure, etc., thereby preventing the wiring layer from expansion or peeling, and thus a semiconductor device having a high package reliability can be obtained.

In this connection, JP-A 2-49544 (=EP160439) and JP-A 4-363032 (=EP504669) disclose similar structures to that of the present stress buffer layer, but JP-A 2-49544 is directed to a printed substrate and JP-A 4-363032 is directed to quite a different semiconductor device structure from that of the present invention.

Embodiments according to the present invention will be described in detail below, referring to Examples and Drawings.

EXAMPLE 1

Figure 2A:
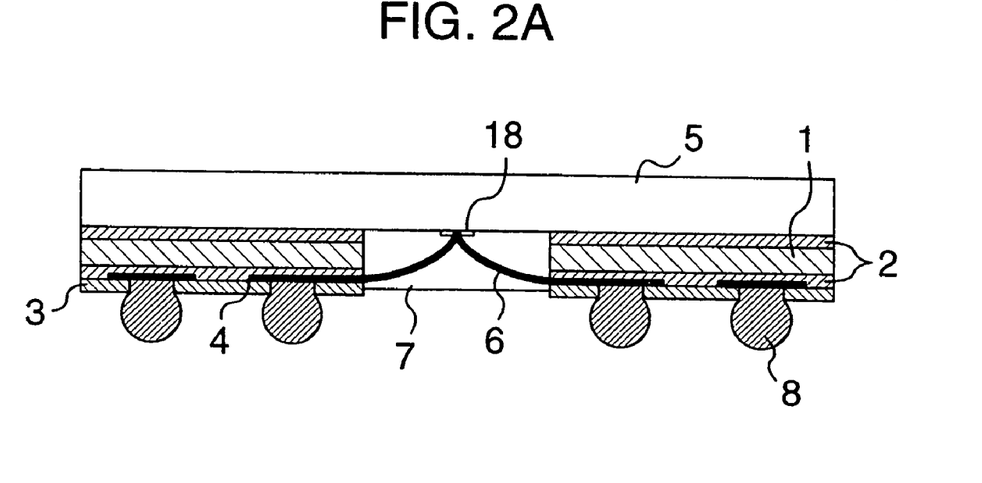
FIG. 2A is a schematic cross-sectional view thereof and FIG. 2B is a bottom plan view thereof.
Figure 2B:
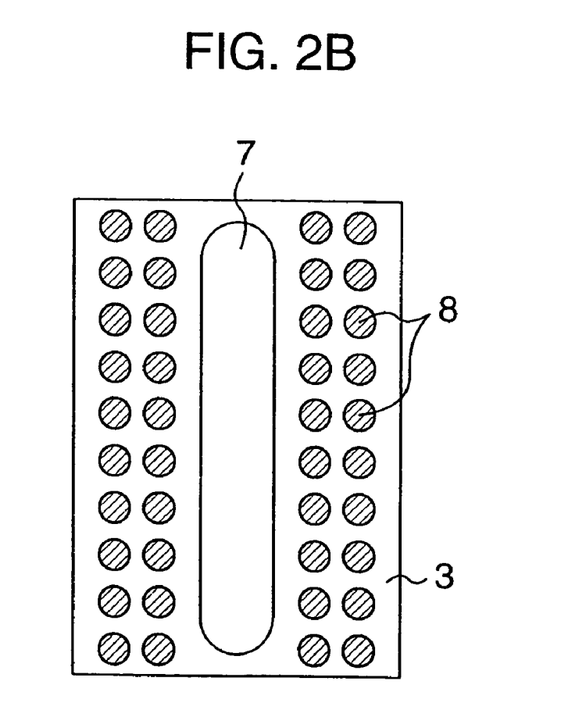

FIGS. 2A and 2B shows a semiconductor device according to one embodiment of the present invention, where FIG. 2A is a schematic cross-sectional view of the present semiconductor device and FIG. 2B a bottom plan view thereof. The semiconductor device was prepared according to the following steps.

Long polyimide film 3 (Upilex, trademark of a product commercially available from Ube Industries, Ltd., Japan), 38 mm wide and 50 μm thick, coated with an epoxy-based adhesive was punched to form a window (1.5 mm×8 mm) for chip connection. Then, an electrolytic copper foil, 18 μm thick, was pressure-rolled onto the polyimide film with a roller heated at 150° C. Then, a photosensitive resist (P-RS 300S, identification mark of a product commercially available from Tokyo Ohka Kogyo Co., Ltd., Japan) was applied to the rolled copper foil, then baked at 90° C. for 30 minutes and subjected to light exposure through a pattern, followed by development, thereby forming an etching mask. Then, the copper was etched with iron chloride at 40° C. and then the resist was removed by peeling to form a copper wiring. The wiring was electrically gold-plated to obtain a wiring substrate (wiring layer) with gold-plated wiring 4.

On the other hand, a thermoplastic polyetheramide-imide varnish (HM-1, identification mark of a product commercially available from Hitachi Chemical Co., Ltd., Japan) was applied to a thickness of 30 μm onto both sides of polytetrafluoroethylene core layer 1 having a three-dimensional reticular structure, 150 μm thick, prepared according to a stretching process, each to a thickness of 30 μm, followed by drying to prepare an adhesive sheet (buffer layer) having adhesive layers 2 on both sides. The adhesive sheet had core layer 1 soaking the adhesive to a depth of about 10 μm. The adhesive sheet was punched to a desired shape on a die, and then pressure-rolled onto the wiring substrate with heating at 250° C. for 2 seconds to prepare a wiring tape.

Semiconductor chip 5 having a group of aluminum terminals arranged in one direction in the central region on the circuit-formed surface was pasted with the wiring tape at 250° C. for 2 seconds by positioning. Then, leads 6 protruded from the wiring layer were connected to aluminum pads 18 as terminals of the semiconductor chip by applying ultrasonic waves thereto. The connected terminal region was sealed with silicone-based sealant 7 (TSJ 3150, identification mark of a product commercially available from Toshiba Silicone Co., Ltd., Tokyo) and heat set at 150° C. for 4 hours. A flux was applied to the external terminal connection region of the wiring layer, and eutectic solder balls (Pb 63: Sn 37), 0.6 mm in diameter, were placed thereon and subjected to IR reflow heating at 240° C. for 5 seconds to form solder ball connection terminals 8.

The semiconductor device so prepared is prevented from expansion or peeling of the wiring layer because the steam can be released from the side ends of porous buffer layer and has such an advantage that the adhesive layers can attain adhesion for a short time because it is made from a thermoplastic resin. Furthermore, the wiring layer and the buffer layer are provided with a common window, through which a sealant can be filled to attain sealing, and thus sealing can be made easily and assuredly. Still furthermore, leads protruded from the wiring layer are directly connected to terminals of semiconductor chip, and thus there is no necessity for using any additional connection members. Still furthermore, use of the adhesive sheet can simplify the production process and thus the mass production capacity can be improved.

The semiconductor device having solder ball connection terminals within the semiconductor chip area prepared according to the foregoing steps was subjected to moisture absorption in a circumstance at a temperature of 85° C. and a relative humidity of 85% for 48 hours and then to a reflow test under the same conditions as those for obtaining the data as shown in FIG. 1. Furthermore, the time required from the buffer layer formation to the chip pasting was measured. Still furthermore, a connection failure rate in connecting the leads to the semiconductor chip was evaluated. Results are shown in Table 1. No connection failure was detected.

EXAMPLE 2

Figure 3:
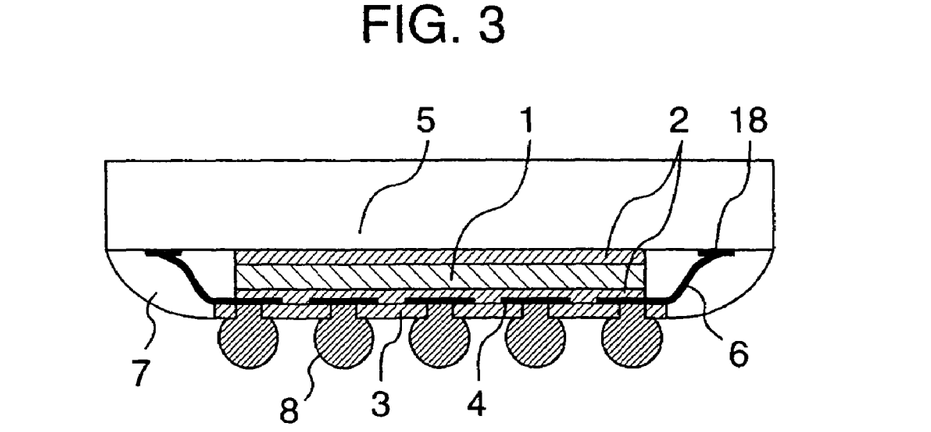
FIG. 3 is a schematic cross-sectional view of a semiconductor device according to another embodiment of the present invention.

FIG. 3 is a schematic cross-sectional view of a semiconductor device according to another embodiment of the present invention. The semiconductor device was prepared according to the following steps.

Long polyimide film 3 (Upilex, trademark of a product commercially available from Ube Industries, Ltd., Japan), 38 mm wide and 50 μm thick, coated with an epoxy-based adhesive was punched to form a window (1.5 mm×8 mm) for chip connection. Then, an electrolytic copper foil, 18 μm thick, was pressure-rolled onto the polyimide film with a roller heated at 150° C. Then, a photosensitive resist (P-RS300S, identification mark of a product commercially available from Tokyo Ohka Kogyo Co., Ltd., Japan) was applied to the rolled copper foil, then baked at 90° C. for 30 minutes and subjected to light exposure through a pattern, followed by development, thereby forming an etching mask. Then, the copper was etched with iron chloride at 40° C. and then the resist was removed by peeling to form a copper wiring. The wiring was electrically gold-plated to obtain a wiring substrate (wiring layer) with gold-plated wiring 4.

A varnish of a thermosetting epoxy resin (YX-4000, identification mark of a product commercially available from Yuka-Shell Epoxy K.K., Japan) in a methyl ethyl ketone solvent, admixed with an o-cresol novolak curing agent (H-1, identification mark of a product commercially available from Meiwa Plastic Industries, Ltd., Japan) and further with a fine silica filler (R974, identification mark of a product commercially available from Nippon Aerosil Co., Ltd., Japan), nitrobutadiene rubber (XER-91, identification mark of a product commercially available from Japan Synthetic Rubber Co., Ltd., Japan) and an epoxy-curing catalyst composed of triphenylsulfone (TPP, identification mark of a product commercially available from Wako Pure Chemical Industries, Ltd., Japan) was applied to both sides of polyimide core layer 1 (thickness: 120 μm) having a three-dimensional reticular structure, prepared according to a layer transfer process, each to a thickness of 30 μm, followed by drying to prepare adhesive layers, each 30 μm thick. An adhesive sheet (buffer layer) having adhesive layers 2 on both sides, obtained by pasting the core layer with the adhesive layers on both sides through a roll laminator, was punched to a desired shape on a die and pressure-roll onto the wiring substrate having the patterned wiring with heating at 120° C. for 2 seconds to form a wiring tape.

Semiconductor chip 5 having a group of terminals arranged in the peripheral region on the circuit-formed surface was pasted with the wiring tape at 120° C. for 2 seconds by positioning. Then, leads 6 protruded from the wiring layer were connected to aluminum pads 18 as terminals of the semiconductor chip by applying ultrasonic waves thereto. The connected terminal region was sealed with epoxy-based sealant 7 (RC021C, identification mark of a product commercially available from Hitachi Chemical Co., Ltd., Japan) and heat set at 80° C. for 30 minutes and at 150° C. for 4 hours. A flux was applied to the solder ball connection region of the wiring layer, and eutectic solder balls (Pb 63: Sn 37), 0.6 mm in diameter, were placed thereon and subjected to IR reflow heating at 240° C. for 5 seconds to form solder ball connection terminals 8. The semiconductor device of this structure has, in addition to the effects as obtained in Example 1, a such further effect that the adhesive sheet (buffer layer) can attain adhesion to the semiconductor chip at a relatively low temperature, because the thermosetting resin is used as an adhesive for the buffer layer.

The semiconductor device prepared according to the foregoing steps was subjected to moisture absorption in a circumstance at a temperature of 85° C. and a relative humidity of 85% for 48 hours and then to a reflow test under the same conditions as those for obtaining the data as shown in FIG. 1. Furthermore, the time required from the buffer layer formation to the chip pasting was measured. Still furthermore, a connection failure rate in connecting the leads to the semiconductor chip was evaluated. Results are shown in Table 1.

EXAMPLE 3

Figure 4A:
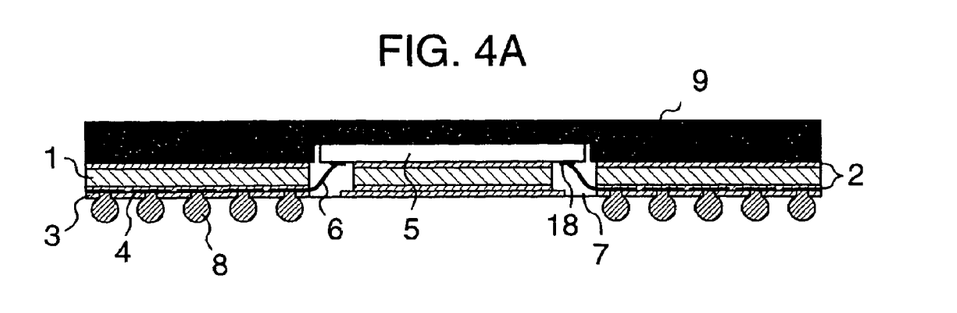
FIG. 4A is a schematic cross-sectional view thereof and FIG. 4B is a bottom plan view thereof.
Figure 4B:
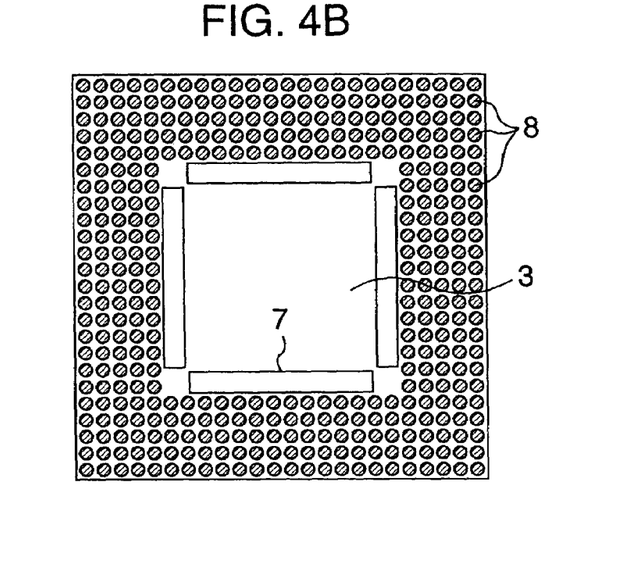

FIGS. 4A and 4B show a semiconductor device according to a further embodiment of the present invention, where FIG. 4A is a schematic cross-sectional view thereof and FIG. 4B is a bottom plan view thereof. The present semiconductor device was prepared according to the following steps.

Long polyimide film 3 (Upilex, trademark of a product commercially available from Ube Industries, Ltd., Japan), 38 mm wide and 50 μm thick, coated with an epoxy-based adhesive was punched to form 4 windows (1.5 mm×8 mm for each) for chip connection. Then, an electrolytic copper foil, 18 μm thick, was pressure-rolled onto the polyimide film with a roller heated at 150° C. Then, a photo-sensitive resist (P-RS 300S, identification mark of a product commercially available from Tokyo Ohka Kogyo Co., Ltd., Japan) was applied to the rolled copper foil, then baked at 90° C. for 30 minutes and subjected to light exposure through a pattern, followed by development, thereby forming an etching mask. Then, the copper was etched with iron chloride at 40° C. and then the resist was removed by peeling to form a copper wiring. The wiring was electrically gold-plated to obtain a wiring substrate (wiring layer) with gold-plated wiring 4.

A varnish of a thermosetting epoxy resin (YX-4000, identification mark of a product commercially available from Yuka-Shell Epoxy K.K., Japan) in a methyl ethyl ketone solvent, admixed with an o-cresol novolak curing agent (H-1, identification mark of a product commercially available from Meiwa Plastic Industries, Ltd., Japan) and further with a fine silica filler (R974, identification mark of a product commercially available from Nippon Aerosil Co., Ltd., Japan), nitrobutadiene rubber (XER-91, identification mark of a product commercially available from Japan Synthetic Rubber Co., Ltd., Japan) and an epoxy-curing catalyst composed of triphenylsulfone (TPP, identification mark of a product commercially available from Wako Pure Chemical Industries, Ltd., Japan) was applied to both sides of polyimide non-woven fabric core layer 1 (thickness: 50 μm) prepared by a wet process each to a thickness of 30 μm, followed by drying to prepare an adhesive sheet (buffer layer) having adhesive layers 2 on both sides. The adhesive sheet was punched to a desired shape on a die, and then pressure-rolled onto the wiring substrate having the patterned wiring with heating at 120° C. for 2 seconds to form a wiring tape.

Semiconductor chip 5 having a group of terminals arranged in the peripheral region on the circuit-formed surface was pasted with the wiring tape at 120° C. for 2 seconds by positioning and further with semiconductor support substrate 9 under the same conditions as above. Then, leads 6 protruded from the wiring layer were connected to aluminum pads 18 as terminals of the semiconductor chip by applying ultrasonic waves thereto. The connected terminal regions were sealed with epoxy-based sealant 7 (TSJ 3150, identification mark of a product commercially available from Toshiba Silicone Co., Ltd., Japan) and heat set at 150° C. for 4 hours. A flux was applied to the solder ball connection region of the wiring layer, and eutectic solder balls (Pb 63: Sn 37), 0.6 mm in diameter, were placed thereon and subjected to IR reflow heating at 240° C. for 5 seconds to form solder ball connection terminals 8.

The semiconductor device having solder ball connection terminals outside the semiconductor chip region prepared according to the foregoing steps was subjected to moisture absorption in a circumstance at a temperature of 85° C. and a relative humidity of 85% for 48 hours and then to a reflow test under the same conditions as those for obtaining the data as shown in FIG. 1. Furthermore, the time required from the buffer layer formation to the chip pasting was measured. Still furthermore, a connection failure rate in connecting the leads to the semiconductor chip was evaluated. Results are shown in Table 1.

EXAMPLE 4

Figure 5:
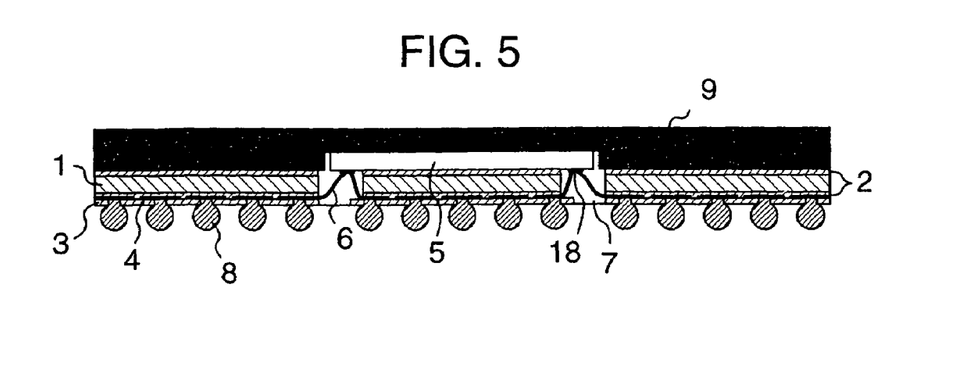
FIG. 5 shows a semiconductor device according to a still further embodiment of the present invention.

FIG. 5 is a schematic cross-sectional view showing a semiconductor device according to a still further embodiment of the present invention. The present semiconductor device was prepared according to the following steps.

Long polyimide film 3 (Upilex, trademark of a product commercially available from Ube Industries, Ltd., Japan), 38 mm wide and 50 μm thick, coated with an epoxy-based adhesive was punched to from 4 windows (1.5 mm×8 mm for each) for chip connection. Then, an electrolytic copper foil, 18 μm thick, was pressure-rolled onto the polyimide film with a roller heated at 150° C. Then, a photosensitive resins (P-RS 300S, identification mark of a product commercially available from Tokyo Ohka Kogyo Co., Ltd., Japan) was applied to the rolled copper foil, then baked at 90° C. for 30 minutes and subjected to light exposure through a pattern, followed by development, thereby forming an etching mask. Then, the copper was etched with iron chloride at 40° C. and then the resist was removed by peeling to form a copper wiring. The wiring was electrically gold-plated to obtain a wiring substrate (wiring layer) with gold plated wiring 4.

An adhesive layer prepared by impregnating a 30 µm-thick polytetrafluoroethylene film having a three-dimensional reticular structure, prepared by a stretching process, with a varnish of epoxy resin (YX-4000, identification mark of a product commercially available from Yuka-Shell Epoxy K.K., Japan) in a methyl ethyl ketone solvent, admixed with an o-cresol novolak curing agent (H-1, identification mark of a product commercially available from Meiwa Plastic Industries, Ltd., Japan) and an epoxy-curing catalyst composed of triphenylsulphone (TPP, identification mark of a product commercially available from Wako Pure Chemical Industries, Ltd., Japan), followed by drying, was pasted to both sides of polytetrafluoroethylene core layer 1 (thickness: 100 µm) having a three-dimensional reticular structure, prepared by the same stretching process as above, through a roll laminator, to form an adhesive sheet (buffer layer) having adhesive layers 2 on both sides. Then, the adhesive sheet was punched into a desired shape on a die, and pressure rolled onto the wiring substrate with the patterned wiring with heating at 120° C. for 2 seconds to form a wiring tape.

Semiconductor chip 5 having a group of terminals arranged in the peripheral region on the circuit-formed surface was pasted with the wiring tape at 120° C. for 2 seconds by positioning and further with semiconductor support substrate 9 under the same conditions as above. Then, leads 6 protruded from the wiring layer were connected to aluminum pads 18 as terminals of the semiconductor chip by applying ultrasonic waves thereto. The connected terminal regions were sealed with epoxy-based sealant 7 (RCO21C), identification mark of a product commercially available from Hitachi Chemical Co., Ltd., Japan) and heat set at 80° C. for 30 minutes and at 150° C. for 4 hours. A flux was applied to the solder ball connection region of the wiring layer, and eutectic solder balls (Pb 63: Sn 37), 0.6 mm in diameter, were placed thereon and subjected to IR reflow heating at 240° C. for 5 seconds to form solder ball connection terminals 8.

The semiconductor device having solder ball connection terminals inside and outside the semiconductor device region prepared according to the foregoing steps was subjected to moisture absorption in a circumstance at a temperature of 85° C. and a relative humidity of 85% for 48 hours and then to a reflow test under the same conditions as those for obtaining the data as shown in FIG. 1. Furthermore, the time required from the buffer layer formation to the chip pasting was measured still furthermore, a connection failure rate in connecting the leads to the semiconductor chip was evaluated. Results are shown in Table 1.

EXAMPLE 5

Figure 6A:
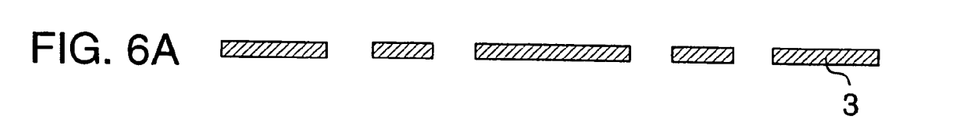
FIGS. 6A to 6F are schematic views showing steps of preparing a wiring tape according to the present invention.
Figure 6B:
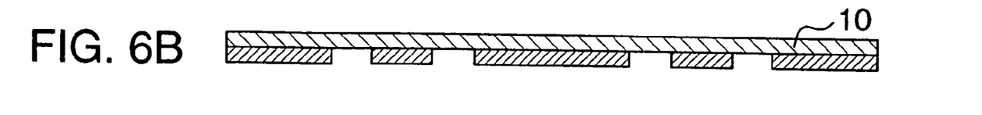
Figure 6C:
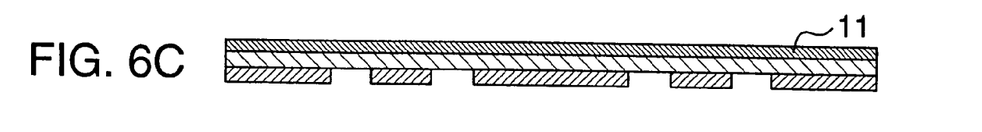
Figure 6D:
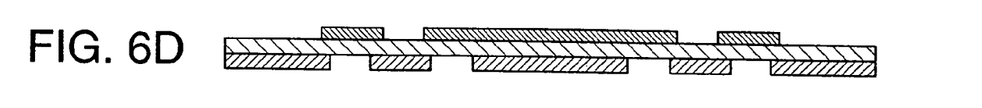
Figure 6E:
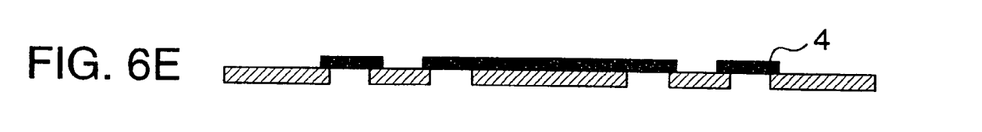
Figure 6F:
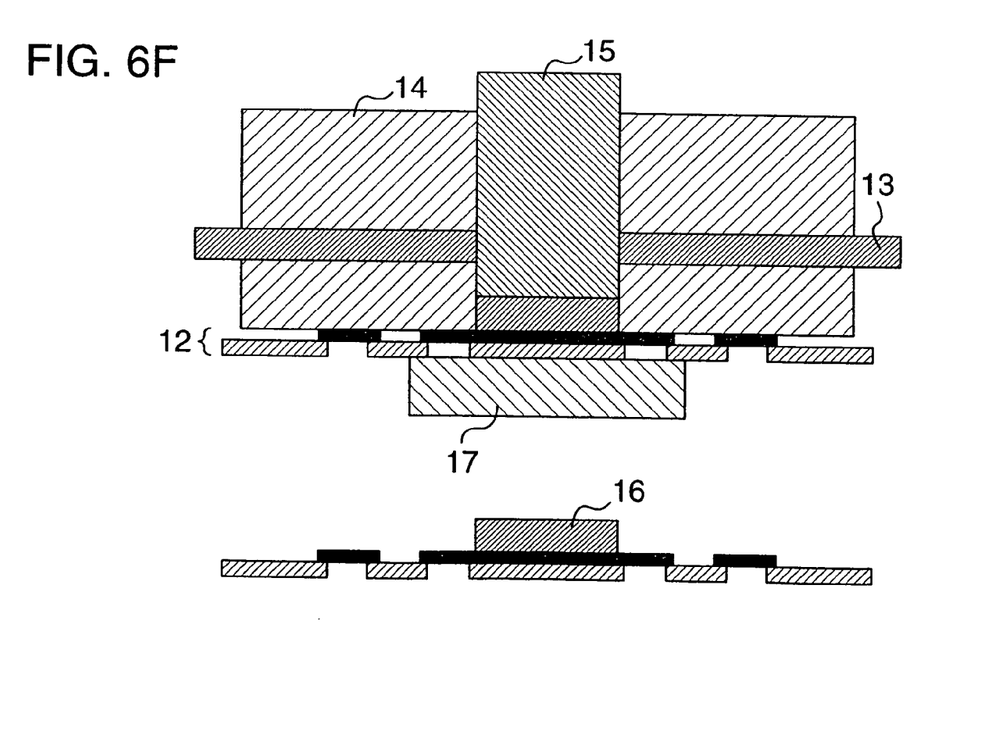

The present wiring tape was prepared according to the following steps. FIGS. 6A to 6F schematically show the steps.
(a) Long polyimide film 3 (Upilx, trademark of a product commercially available from Ube Industries, Ltd., Japan), 38 mm wide and 50 µm thick, coated with an epoxy-based adhesive was punched to form windows for chip connection (FIG. 6A).
(b) Electrolytic copper foil 10, 18 µm thick, was pressure-rolled onto the polyimide film with a roller heated at 150° C. (FIG. 6B).
(c) A photoresist 11 (P-RS 300S, identification mark of a product commercially available from Tokyo Ohka Kogyo Co., Ltd., Japan) was applied to the rolled copper foil and baked at 90° C. for 30 minutes (FIG. 6C).
(d) The resist was subjected to light exposure through a pattern, followed by development, thereby forming an etching mask (FIG. 6D).
(e) The copper was etched with iron chloride at 40° C. and then the resist was removed by peeling to form a copper wiring, and the top surface of wiring was electrically gold-plated to form gold-plated wiring 4 (FIG. 6E).
(f) Wiring tape 12 with the patterned wiring so prepared was fixed onto stage 17 heated at 250° after positioning. Long stress-buffering adhesive film 13 obtained by impregnating cloth of polytetrafluoroethylene resin fibers, 150 µm thick, prepared by a stretching process, with a polyetheramide-imide varnish (HM-1, identification mark of a product commercially available from Hitachi Chemical Co., Ltd., Japan), followed by drying, was punched into a desired shape by means of a set of die 14 and punch 15, and pressure-rolled onto the wiring tape with heating for one second to form stress-buffering adhesive layer 16 (FIG. 6F).

COMPARATIVE EXAMPLE 1

A semiconductor device was prepared in the same manner as in Example 1, using a stress buffer layer comprising a polyimide film core layer, 150 µm thick, and the same adhesive layers (thickness: 30 µm) as in Example 1 on both sides of the core layer. The semiconductor device was subjected to moisture absorption in a circumstance at a temperature of 85° C. and a relative humidity of 85% for 48 hours and then to a reflow test under the same conditions as those for obtaining the data as shown in FIG. 1. Furthermore, the time required from the buffer layer formation to the chip pasting was measured. Still furthermore, a connection failure rate in connecting the leads to the semiconductor chip was evaluated. Results are shown in Table 1.

COMPARATIVE EXAMPLE 2

A semiconductor device was prepared in the same manner as in Example 2, using a 150 µm-thick sheet only of the same adhesive layer as used in Example 2 as a buffer layer. The semiconductor device was subjected to moisture absorption in a circumstance at a temperature of 85° C. and a relative humidity of 85% and then to a reflow test under the same conditions as those for obtaining the data as shown in FIG. 1. Furthermore, the time required from the buffer layer formation to the chip pasting was measured. Still furthermore, a connection failure rate in connecting the leads to the semiconductor chip was evaluated. Results are shown in Table 1.

COMPARATIVE EXAMPLE 3

A metal mask was laid on the same wiring layer as in Example 1, and a liquid, addition-type silicone elastomer having a viscosity of 900 Pa.s (TSE322, identification mark of a product commercially available from Toshiba Silicone Co., Ltd., Japan) was printed thereon by an urethane rubber squeeze and cured at 150° C. for one hour to form a buffer layer, 150 μm thick. A silicone-based adhesive (KE 1820, identification mark of a product commercially available from Shin-Etsu Chemical Co., Ltd., Japan) was applied to the buffer layer to a thickness of 30 μm by screen printing and, after positioning, pasted with a semiconductor chip at 180° C. for one minute. Leads protruded from the wiring layer were connected to aluminum pads on the semiconductor chip. Connected terminal region was sealed with a silicone-based sealant (TSJ 3150, identification mark of a product commercially available from Toshiba Silicone Co., Ltd., Japan), followed by heat setting at 150° C. for 4 hours. A flux was applied to solder ball connection region to the wiring layer, and eutectic solder balls (Pb 63: Sn 37), 0.6 mm in diameter, were placed thereto, followed by IR reflow heating at 250° C. for 5 seconds to form solder ball connection terminals.

The semiconductor device prepared according to the foregoing process was subjected to moisture absorption in a circumstance at a temperature of 85° C. and a relative humidity of 85% for 48 hours and then to a reflow test under the same conditions as those for obtaining the data shown in FIG. 1. Furthermore, the time required from the buffer layer formation to the chip pasting was measured. Still furthermore, a connection failure rate in connecting the leads to the semiconductor chip was evaluated. Results are shown in Table 1.

TABLE 1

|  | Failure rate at package reflow (Number of failures/total test number) | Time required from buffer layer formation to chip pasting (seconds) | Connection failure rate between lead and pad (Number of failure/total test number) |
|---|---|---|---|
| Ex. 1 | 0/30 | 10 | 0/100 |
| Ex. 2 | 0/30 | 10 | 0/100 |
| Ex. 3 | 0/30 | 10 | 0/100 |
| Ex. 4 | 0/30 | 10 | 0/100 |
| Comp. Ex. 1 | 28/30 | 10 | 0/100 |
| Comp. Ex. 2 | 29/30 | 10 | 0/100 |
| Comp. Ex. 3 | 0/30 | 80 + Curing time (1 h) | 65/100 |

The present semiconductor devices shown in Examples 1 to 4 had a low connection failure rate due to the absence of lead contamination, as compared with the semiconductor device of Comparative Example 3 and also had a short processing time, and particularly no failure at the reflow test in contrast with the semiconductor devices of Comparative Examples 2 and 3.

The present semiconductor devices having a stress buffer elastomer layer have no expansion or breakage of wiring layer when packaged, because the core layer in the buffer layer is in an interconnected foam structure or a three-dimensional reticular structure and thus the steam pressure generated at the package reflow can be released through the core layer.

What is claimed is:

1. A wiring tape for a semiconductor device, which comprises a wiring layer comprising an insulating layer and a wiring on the insulating layer, one end of the wiring being connected to terminals on a semiconductor chip and the other end of the wiring being connected to external terminals for connecting to a package substrate; and a three-layered buffer elastomer layer bonded to a wiring-formed side of the wiring layer, the buffer elastomer layer comprising a structure having interconnected foams or a three-dimensional reticular structure, an adhesive layer provided on the semiconductor chip-facing side of the structure having interconnected foams or the three-dimensional reticular structure, to bond to the semiconductor chip and another adhesive layer provided on the other side of the structure, to bond to the wiring-formed side of the wiring layer to relax thermal stress generated between the semiconductor chip and the package substrate during heating.

2. A wiring tape according to claim 1, wherein a thickness ratio of the structure having interconnected foams or the three-dimensional reticular structure to total buffer layer thickness is at least 0.2 to reduce the likelihood of failure of the semiconductor device during heating performed in a reflow operation used in manufacturing the semiconductor device.

3. A wiring tape according to claim 1, wherein the buffer layer is comprised of a laminate prepared by pasting both sides of the structure having interconnected foams or the three-dimensional reticular structure with the adhesive layers, respectively.

4. A wiring tape according to claim 1, wherein the buffer layer is composed of a laminate prepared by pasting both sides of the structure having interconnected foams with adhesive layers each comprising a structure having interconnected foams whose pores are filled with an adhesive, respectively.

5. A wiring tape according to claim 1, wherein the adhesive layer on the semiconductor chip-facing side is directly bonded to the semiconductor chip and the other adhesive layer is directly bonded to the wiring-formed side of the wiring layer.

6. A wiring tape for a semiconductor device, which comprises a wiring layer comprising an insulating layer and a wiring on the insulating layer, one end of the wiring being connected to terminals on a semiconductor chip and the other end of the wiring being connected to external terminals for connecting to a package substrate; and means for relaxing thermal stress generated between the semiconductor chip and the package substrate and for releasing steam pressure generated during heating in a reflow operation used in forming a package, including the wiring tape and the semiconductor device, to outside of the package, said means comprising:

a three-layered buffer elastomer layer bonded to a wiring-formed side of the wiring layer, the buffer elastomer layer comprising a structure having interconnected foams or a three-dimensional reticular structure, an adhesive layer provided on the semiconductor chip-facing side of the structure having interconnected foams or the three-dimensional reticular structure, to bond to the semiconductor chip and another adhesive layer provided on the other side of the structure, to bond to the wiring-formed side of the wiring layer.

7. A wiring tape according to claim 6, wherein a thickness ratio of the structure having interconnected foams or the three-dimensional reticular structure to total buffer layer thickness is at least 0.2 to reduce the likelihood of failure of the semiconductor device during heating performed in a reflow operation used in manufacturing the semiconductor device.

8. A wiring tape according to claim 6, wherein the buffer layer is comprised of a laminate prepared by pasting both sides of the structure having interconnected foams or the three-dimensional reticular structure with the adhesive layers, respectively.

9. A wiring tape according to claim 6, wherein the adhesive layer on the semiconductor chip-facing side is directly bonded to the semiconductor chip and the other adhesive layer is directly bonded to the wiring-formed side of the wiring layer.

* * * * *